(12) United States Patent
Deguchi et al.

(10) Patent No.: US 6,608,666 B2
(45) Date of Patent: Aug. 19, 2003

(54) REFERENCE PLATE, EXPOSURE APPARATUS, DEVICE MANUFACTURING SYSTEM, DEVICE MANUFACTURING METHOD, SEMICONDUCTOR MANUFACTURING FACTORY, AND EXPOSURE APPARATUS MAINTENANCE METHOD

(75) Inventors: Nobuyoshi Deguchi, Tochigi (JP); Tetsuya Mori, Tochigi (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/881,804

(22) Filed: Jun. 18, 2001

(65) Prior Publication Data

US 2002/0067473 A1 Jun. 6, 2002

(30) Foreign Application Priority Data

Jun. 19, 2000 (JP) ........................ 2000-183410

(51) Int. Cl.⁷ .......................... G03B 27/42; G03B 27/52
(52) U.S. Cl. ........................................ 355/53; 355/55
(58) Field of Search ................................ 355/53, 55

(56) References Cited

U.S. PATENT DOCUMENTS

| | | | | |
|---|---|---|---|---|
| 3,354,806 A | * | 11/1967 | Lang et al. ............ 250/559.44 |
| 5,477,309 A | * | 12/1995 | Ota et al. ..................... 355/53 |
| 5,498,878 A | | 3/1996 | Hasegawa et al. .......... 250/548 |
| 5,532,091 A | * | 7/1996 | Mizutani ..................... 355/53 |
| 5,793,472 A | * | 8/1998 | Hori et al. ................... 355/53 |
| 5,971,577 A | | 10/1999 | Mori et al. ................. 362/575 |
| 5,981,352 A | * | 11/1999 | Zhao et al. ................. 438/401 |
| 6,091,481 A | | 7/2000 | Mori ............................ 355/67 |
| 6,197,481 B1 | * | 3/2001 | Chang et al. ................ 430/22 |
| 6,242,792 B1 | * | 6/2001 | Miura et al. ............... 257/516 |
| 6,249,336 B1 | * | 6/2001 | Ota ............................. 355/53 |
| 6,294,018 B1 | * | 9/2001 | Hamm et al. ................ 117/90 |
| 6,326,278 B1 | * | 12/2001 | Komuro ..................... 438/401 |
| 6,327,025 B1 | * | 12/2001 | Imai ........................ 250/492.2 |
| 6,342,426 B1 | * | 1/2002 | Li et al. ....................... 430/22 |
| 6,417,076 B1 | * | 7/2002 | Holscher et al. .......... 29/25.01 |

\* cited by examiner

Primary Examiner—Rodney Fuller
(74) Attorney, Agent, or Firm—Fitzpatrick, Cella, Harper & Scinto

(57) ABSTRACT

A reference plate used with an exposure apparatus that emits an exposure beam to irradiate a reference mark pattern with observation light, to detect the reflected light, and to obtain a position of the reference mark pattern. A respective reference plate is fixed on a mask stage and a wafer stage of the exposure apparatus for exposing a wafer on the wafer stage to a mask pattern on the mask stage, and a surface of the reference mark pattern, which is an observation light irradiation surface side of the exposure apparatus, is not directly exposed to the surrounding atmosphere.

17 Claims, 9 Drawing Sheets

FIG. 7

| | |
|---|---|
| URL | http://www.maintain.co.jp/db/input.html |

TROUBLE DB INPUT WINDOW

OCCURRENCE DATE [2000/3/15] ~404
TYPE OF APPARATUS [**********] ~401
NAME [OPERATION ERROR (START-UP ERROR)] ~403
APPARATUS S/N [465NS4580001] ~402
DEGREE OF URGENCY [D] ~405

SYMPTOM [LED KEEPS FLICKERING AFTER POWER-ON] ~406

REMEDY [POWER ON AGAIN (PRESS RED BUTTON IN ACTIVATION)] ~407

PROGRESS [INTERIM HAS BEEN DONE] ~408

[SEND] [RESET]  410   411   412
LINK TO RESULT LIST DATABASE   SOFTWARE LIBRARY   OPERATION GUIDE

SEMICONDUCTOR DEVICE MANUFACTURING FLOW

REFERENCE PLATE, EXPOSURE APPARATUS, DEVICE MANUFACTURING SYSTEM, DEVICE MANUFACTURING METHOD, SEMICONDUCTOR MANUFACTURING FACTORY, AND EXPOSURE APPARATUS MAINTENANCE METHOD

FIELD OF THE INVENTION

The present invention relates to a reference plate, an exposure apparatus using the reference plate, a device manufacturing system, a device manufacturing method, a semiconductor manufacturing factory, and an exposure apparatus maintenance method.

BACKGROUND OF THE INVENTION

Measurement precision calibration of an exposure apparatus such as baseline measurement or best focus position measurement conventionally uses a reference plate mounted on a stage. The reference plate bears reference mark patterns formed from a chromium or aluminum film on a glass for X/Y- or Z-direction measurement. These reference mark patterns are observed by a microscope using light of the same wavelength as that of exposure light.

The exposure light of the exposure apparatus is decreasing in wavelength in order to increase the resolution of a projection optical system and to expose a fine pattern.

FIG. 4 is a view for explaining a conventional reference plate. In FIG. 4, the upper views are schematic sectional views of the reference plate. Reference numeral 1 denotes a glass substrate; 2, a reference mark pattern formed from a chromium or aluminum film; and 4, a deposit on the surface of the reference mark pattern 2. The lower views show the wavelength of an observation signal.

When short-wavelength observation light from an ArF excimer laser or $F_2$ excimer laser is used to detect the reference mark pattern 2 by a microscope using the conventional reference mark as shown in FIG. 4, long-time irradiation of illumination light deteriorates the pattern film of the reference mark pattern 2 or forms a deposit on the reference mark pattern 2. The image contrast then gradually decreases, until observation is no longer possible.

If the deposit 4 is formed on the surface of the reference mark pattern 2, as shown in FIG. 4, and decreases the contrast, the surface of the reference mark pattern 2 must be periodically cleaned. However, if a deposit 4 is formed at a step on the surface of the reference mark pattern 2, it is difficult to clean the surface.

SUMMARY OF THE INVENTION

The present invention has been made to overcome the conventional drawbacks, and has as its object to provide a long-service-life reference plate which enables stable high-precision mark detection even with short-wavelength observation light, an exposure apparatus using the reference plate, a device manufacturing system, a device manufacturing method, a semiconductor manufacturing factory, and an exposure apparatus maintenance method.

To achieve the above object, a reference plate according to the present invention has the following features. A reference plate used to irradiate a reference mark pattern with observation light, to detect the reflected light, and to obtain a position of the reference mark pattern, is provided, wherein the reference mark pattern is formed at a position where the reference mark pattern is not directly exposed to the observation light.

To achieve the above object, an exposure apparatus according to the present invention has the following features. An exposure apparatus is provided for exposing a wafer to a mask pattern, comprising reference plates having reference patterns formed at positions where the reference patterns are not directly exposed to observation light, as a mask reference plate formed on a mask stage for supporting a mask and a wafer reference plate formed on a wafer stage for supporting the wafer.

To achieve the above object, a device manufacturing method according to the present invention has the following features. A device manufacturing method comprises the steps of installing, in a semiconductor manufacturing factory, manufacturing apparatuses for performing various processing including an exposure apparatus which exposes a wafer to a mask pattern and uses reference plates having reference patterns formed at positions where the reference patterns are not directly exposed to observation light, as a mask reference plate formed on a mask stage for supporting a mask and a wafer reference plate formed on a wafer stage for supporting the wafer, and manufacturing a semiconductor device by using the manufacturing apparatuses in a plurality of processes.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 7 is a view showing an example of a user interface;

DETAILED DESCRIPTION OF THE PREFERRED EMBODIMENTS

<Embodiment of Reference Plate>

An embodiment of a reference plate according to the present invention will be described with reference to FIGS. 1A to 1C.

Figure 1:
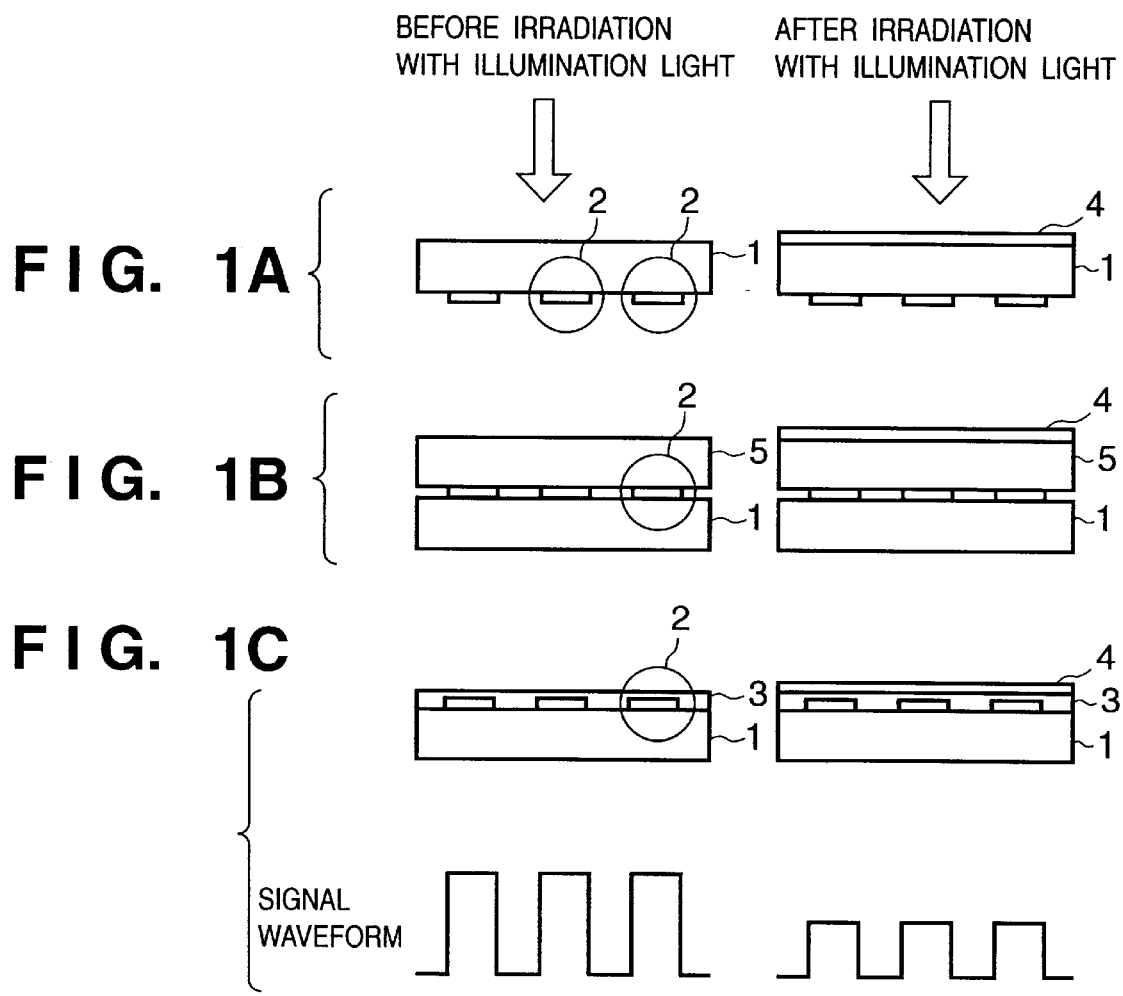
FIGS. 1A to 1C are schematic views showing a reference plate according to an embodiment of the present invention.

In FIGS. 1A to 1C, reference numerals 1 and 5 denote glass substrates; 2, reference marks formed from a chromium pattern; and 3, an $SiO_2$ film. In this embodiment, a thickness d of the glass substrate 1 is adjusted to 30 nm or more, which satisfies nd $=\lambda/2 \times m(m=1,2,3,\ldots)$, where n is the refractive index of the materials of the glass substrate with respect to observation light, and $\lambda$ is the wavelength of the observation light. At this time, the thickness of the glass substrate 1 has a given allowable range in accordance with the performance necessary for an exposure apparatus.

Since the reference marks 2 are formed on a surface opposite to the observation light irradiation surface in the example shown in FIG. 1A, observation light does not directly strike the reference marks 2 formed from the chromium pattern, suppressing deterioration of the reference marks 2. Since a deposit 4 is uniformly formed on the glass substrate 1, the deposit 4 hardly causes contrast changes of a signal waveform, facilitating cleaning.

In FIG. 1B, the glass substrate 5 is identical to the glass substrate 1, and adjusted to the same thickness as that of the glass substrate 1 in FIG. 1A.

Since the glass substrate 5 is stacked on the reference marks 2 in the example shown in FIG. 1B, observation light does not directly hit the reference marks 2 formed from the chromium pattern, suppressing deterioration of the reference marks 2. Since the deposit 4 is uniformly formed on the glass substrate 5, the deposit 4 hardly causes contrast changes of a signal waveform, facilitating cleaning.

In FIG. 1C, the $SiO_2$ film 3 is a protective film. A thickness d from the substrate 1 to the surface of the protective film is adjusted to 30 nm or more, which satisfies $nd = \lambda/2 \times m (m=1,2,3,\ldots)$, where n is the refractive index of the protective film 3 with respect to observation light, and $\lambda$ is the wavelength of the observation light, similar to the arrangement in FIGS. 1A and 1B. At this time, the thickness of the glass substrate 1 has a given allowable range in accordance with the performance necessary for an exposure apparatus.

<Embodiment of Exposure Apparatus>

Figure 2:
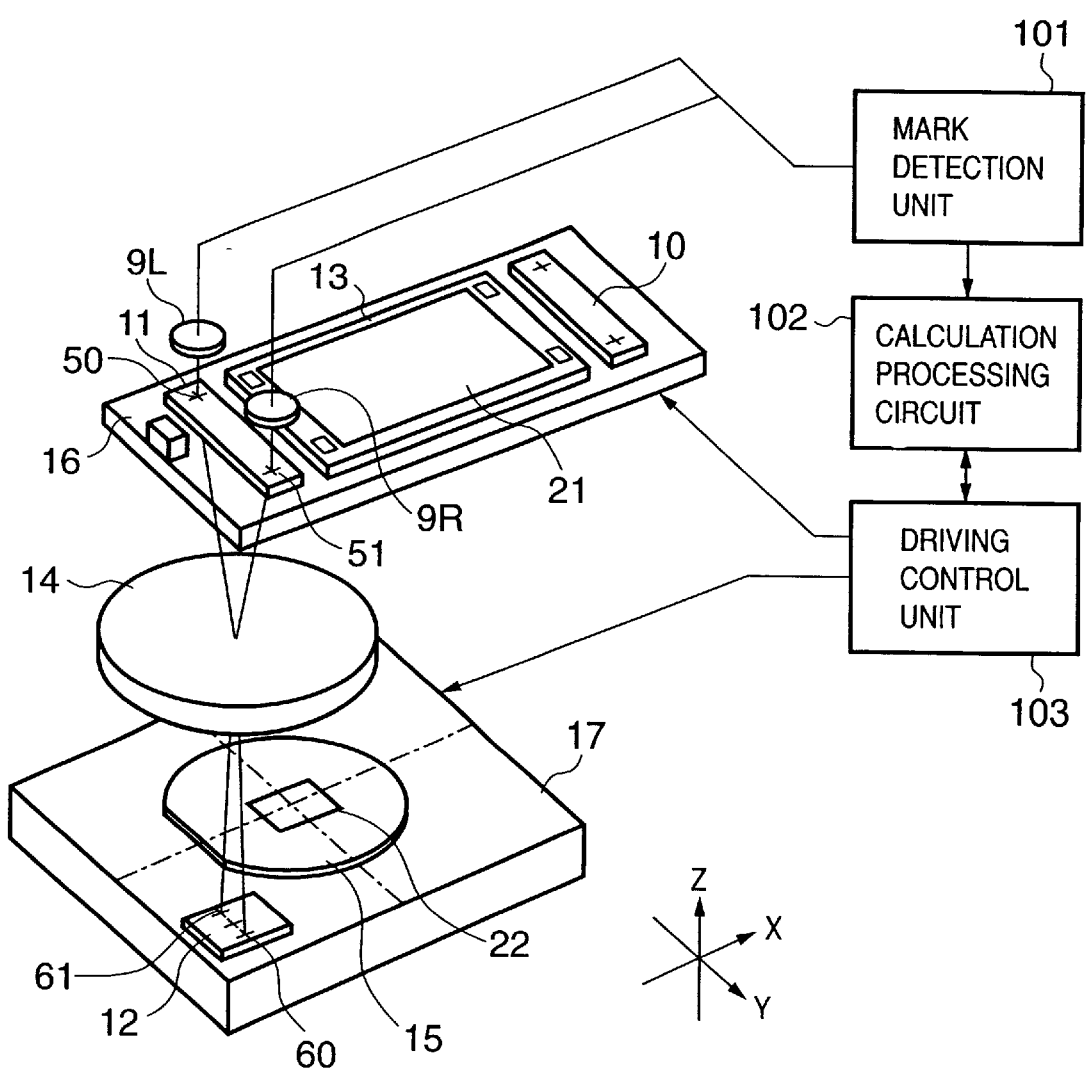
FIG. 2 is a view for explaining an exposure apparatus using the reference plate of the present invention in FIGS. 1A to 1C as mask and wafer reference plates.

An exposure apparatus using the reference plates of the embodiment as mask and wafer reference plates will be described with reference to FIGS. 2 and 3.

The present invention will be explained in detail on the basis of the embodiment shown in FIGS. 2 and 3. FIG. 2 is a schematic view showing a projection exposure apparatus using as an exposure light source an $F_2$ excimer laser to which the present invention is applied. A mask 13 bearing an original image is supported on the apparatus main body by a mask stage 16 which is driven in the X and Y directions by a laser interferometer (not shown) and driving control unit 103. A wafer 15 as a photosensitive substrate is supported on the apparatus main body by a wafer stage 17 which is also driven in the X and Y directions by the laser interferometer (not shown) and driving control unit 103. The mask 13 and wafer 15 are set at optically conjugate positions via a projection optical system 14. Projection exposure is performed by illuminating the mask 13 with an exposure beam from an illumination system (not shown) and projecting the optical image of the mask 13 onto the wafer 15 at a size proportional to the optical magnification of the projection optical system 14.

This embodiment concerns a scanning exposure apparatus. Slit-like exposure light traveling in the Y direction in FIG. 2 illuminates the mask 13, and the mask stage 16 and wafer stage 17 are moved in, the X direction with respect to the slit-like exposure light at a speed ratio corresponding to the optical magnification of the projection optical system 14, thus scanning the mask 13 and wafer 15. The entire surface of a device pattern 21 on the mask 13 is transferred in a transfer region (pattern region) 22 on the wafer 15.

This embodiment has exemplified the projection optical system 14 comprised of only a refraction element. However, the same effects of the present invention can be obtained even with a projection optical system made up of a reflecting element and refraction element, a reduction projection optical system, like this embodiment, or an equal-magnification projection optical system.

Mask reference plates 10 and 11 are fixed on the mask stage 16 in the X direction as a scanning direction with respect to the mask 13. A wafer reference plate 12 is fixed on the wafer stage 17.

Each of the mask reference plates 10 and 11 has reference marks 50 and 51. The wafer reference plate 12 has reference marks 60 and 61 at transfer positions corresponding to the positions of the reference marks 50 and 51 via the projection optical system 14. The reference marks 50 and 51 on each of the mask reference plates 10 and 11 are flush with the pattern-drawn surface of the mask 13, whereas the reference marks 60 and 61 on the wafer reference plate 12 are almost flush with the exposure surface of the wafer 15.

Observation microscopes 9L and 9R enable observing the reference marks 50 and 51 on each of the mask reference plates 10 and 11 and an object (mark) on the pattern-bearing surface of the mask 13, and at the same time observing the reference marks 60 and 61 on the wafer reference plate 12 and an object (mark) on the wafer 15. Photoelectrically observed image signals are processed by a mark detection unit 101, and relative position relationship information is sent to a calculation processing circuit 102.

For simultaneous observation, an $F_2$ excimer laser beam used for projection exposure is used as observation light, which conveniently obviates the need for a new optical system for correcting chromatic aberration generated in the projection optical system 14.

The wafer stage 17 is so driven as to move the reference marks 60 and 61 on the wafer reference plate 12 to the observation positions (exposure positions) of the observation microscopes 9L and 9R under the projection optical system 14. Similarly, the mask stage 16 is moved similarly to scanning exposure so as to position the reference marks 50 and 51 on the mask reference plate 11 within the observation region of the observation microscopes 9L and 9R.

In this state, relative misalignments between the reference marks 50 and 60 and between the reference marks 51 and 61 are observed via the observation microscopes 9L and 9R. This relative position relationship means the position of a currently projected/exposed mask image on the wafer stage 17. In this case, the $F_2$ excimer laser is used as the light source of an exposure apparatus, but an ArF excimer laser may be used as the light source of an exposure apparatus.

Alignment of the mask 13 on the mask stage 16 by using the mask reference plates 10 and 11 in FIG. 2 will be explained with reference to FIG. 3.

Figure 3:
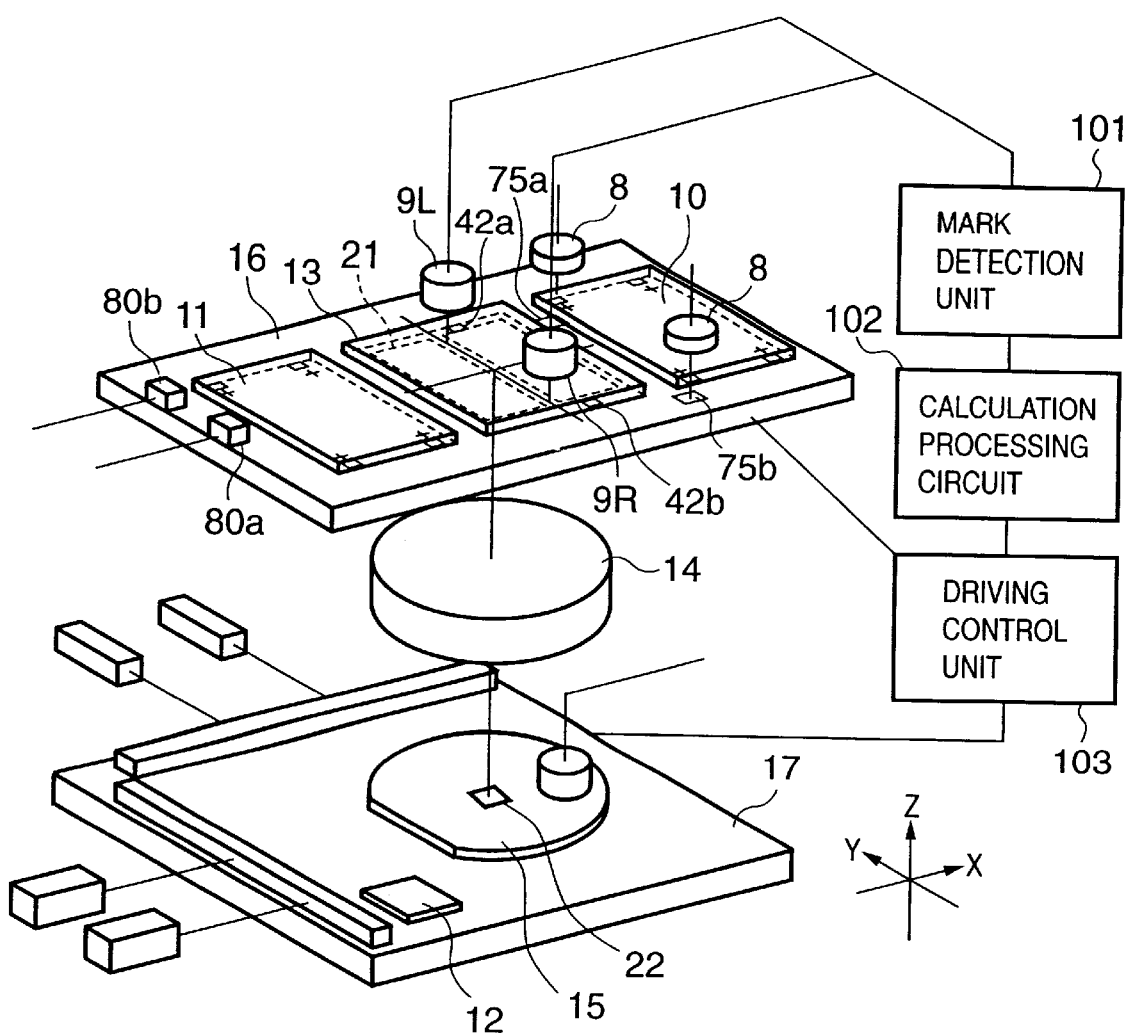
FIG. 3 is a view for explaining mask alignment in the exposure apparatus of FIG. 2.
Figure 4:
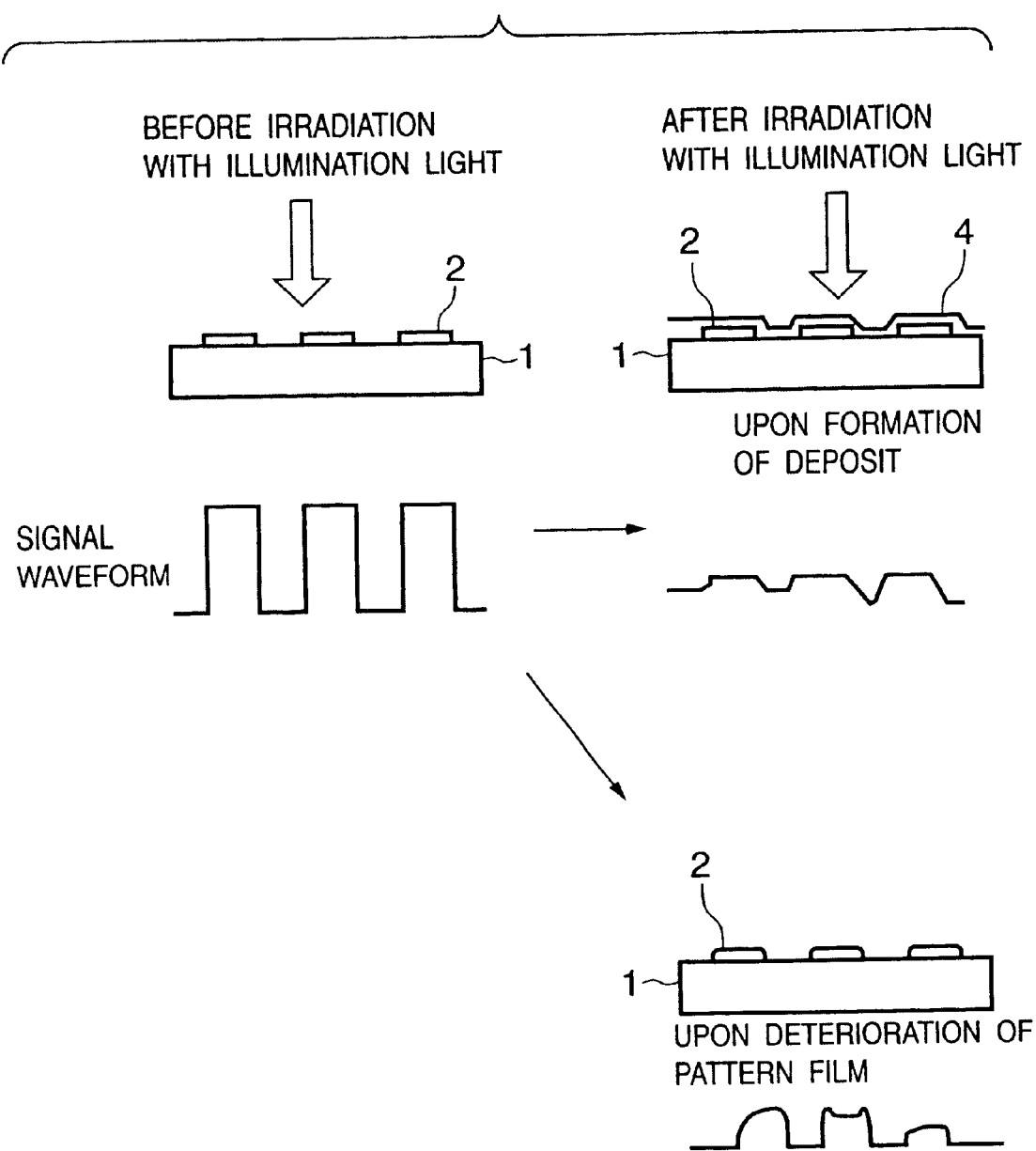
FIG. 4 is a schematic view showing a conventional reference plate.

In this embodiment, as shown in FIG. 3, the mask 13 is aligned by fixing a stationary reference plate (not shown) to a holding member for holding the projection optical system 14, and using marks 75a and 75b formed on the stationary reference plate. The reference plate of the present invention can also be applied as the stationary reference plate.

The mask stage 16 driven in the X direction by laser interferometers 80a and 80b and the driving control unit 103 is moved to move the reference marks 50 and 51 (FIG. 3) on the mask reference plate 10 (or 11) onto the marks 75a and 75b on the stationary reference plate. Then, the relative positional relationship between these marks (50, 51, 75a, and 75b) is measured via a reticle alignment microscope 8. The relative positional relationship between a plurality of alignment reference marks on the mask reference plate 10 (or 11) and a plurality of alignment marks on the stationary reference plate is detected, and the relationship between a coordinate system determined by the plurality of alignment marks on the mask reference plate 10 (or 11) and a coordinate system determined by the plurality of alignment marks on the stationary reference plate is detected. The positional relationship between the marks 75a and 75b on the stationary reference plate and the reference marks 50 and 51 on the mask reference plate 10 (or 11) need not be measured every time the mask is exchanged as long as the positions of the marks 75a and 75b on the stationary reference plate are stable.

The mask stage 16 is moved to position mask alignment marks 42a and 42b on the mask 13 to the marks 75a and 75b. Masks are exchanged near this position.

The relative positional relationship between these marks (42a, 42b, 75a, and 75b) is measured via the reticle alignment microscope 8. The relative positional relationship between the plurality of alignment marks on the mask 13 and the plurality of alignment marks on the stationary reference plate is detected, and the relationship between a coordinate system determined by the plurality of alignment marks on the mask 13 and a coordinate system determined by the plurality of alignment marks on the stationary reference plate is detected. The mask 13 is rotated with respect to the mask stage 16 in consideration of the relationship between the coordinate system determined by the plurality of alignment reference marks on the mask reference plate 10 and the coordinate system determined by the plurality of alignment marks on the stationary reference plate. Alternatively, the driving control unit 103 controls the scanning direction of the mask stage 16 so as to make the scanning direction of the mask 13 coincide with that of the mask stage 16.

This effect can also be attained by arranging the marks 75a and 75b on the stationary reference plate below the mask alignment mark 42b on the mask stage 16 when the mask 13 is at the exposure position.

More specifically, the mask is aligned by moving the mask stage 16 and positioning the reference marks 42a and 42b (or marks 75a and 75b) at observation positions of the reticle alignment microscope 8. At this time, the positional relationship between the marks 75a and 75b and the reference marks 50 and 51 can be measured via the observation microscopes 9R and 9L or the reticle alignment microscope 8 while the mask 13 is set. Also, this positional relationship need not be measured every time the mask is exchanged as long as the positions of the marks 75a and 75b on the stationary reference plate are stable.

Comparative Example

As a comparative example, a reference plate identical to that of the embodiment shown in FIG. 1C, except that $SiO_2$ film was formed on a chromium pattern, was prepared and subjected to a comparison test.

The reference plates prepared as the embodiment (FIG. 1C) and comparative example underwent durability irradiation using an ArF excimer laser beam (4.0 mj/cm$^2$, 1.3×10$^6$ pulses), and changes in reflectivity before and after durability irradiation were measured. Table 1 shows the results.

TABLE 1

|  | Embodiment | Comparative Example |
| --- | --- | --- |
| Reflectivity Before Durability Irradiation | 39% | 40% |
| Reflectivity After Durability Irradiation | 39% | 24% |

As is apparent from Table 1, the reference mark in the comparative example decreases in reflectivity after durability irradiation, while the reference mark in the embodiment does not decrease in reflectivity before and after irradiation.

Since the glass or $SiO_2$ film tightly contracts the chromium (or aluminum film) on the reference plate of the embodiment, the film does not change even by irradiation, and an observation image does not change. Even a deposit on the upper surface of the glass ($SiO_2$ film) does not decrease the contrast, and a pattern can be observed. Further, the upper surface of the glass can be easily cleaned of a substance deposited on it.

<Embodiment of Semiconductor Production System>

A production system for a semiconductor device (e.g., a semiconductor chip such as an IC or LSI, a liquid crystal panel, a CCD, a thin-film magnetic head, a micromachine, or the like) will be exemplified. A trouble remedy or periodic maintenance of a manufacturing apparatus installed in a semiconductor manufacturing factory, or maintenance service such as software distribution is performed by using a computer network outside the manufacturing factory.

Figure 5:
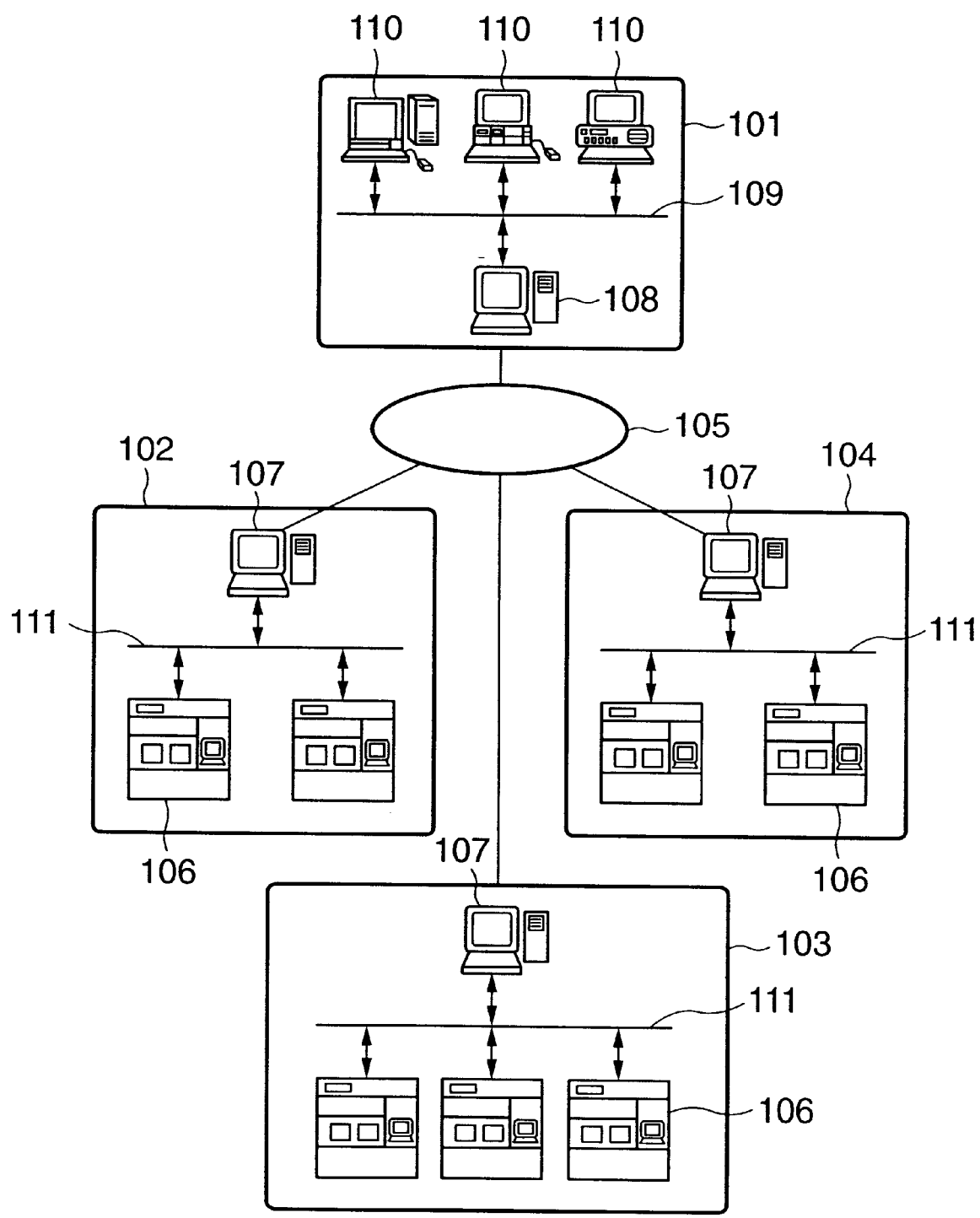
FIG. 5 is a view showing the concept of a semiconductor device production system when viewed from a given angle.

FIG. 5 shows the overall system cut out at a given angle. In FIG. 5, reference numeral 101 denotes a business office of a vendor (apparatus supply manufacturer) which provides a semiconductor device manufacturing apparatus. Assumed examples of the manufacturing apparatus are semiconductor manufacturing apparatuses for performing various processes used in a semiconductor manufacturing factory, such as pre-process apparatuses (e.g., a lithography apparatus including an exposure apparatus, a resist processing apparatus, and an etching apparatus, an annealing apparatus, a film formation apparatus, a planarization apparatus, and the like) and post-process apparatuses, (e.g, an assembly apparatus, an inspection apparatus, and the like). The business office 101 comprises a host management system 108 for providing a maintenance database for the manufacturing apparatus, a plurality of operation terminal computers 110, and a LAN (Local Area Network) 109, which connects the host management system 108 and computers 110 to build an intranet. The host management system 108 has a gateway for connecting the LAN 109 to Internet 105 as an external network of the business office, and a security function for limiting external accesses.

Reference numerals 102 to 104 denote manufacturing factories of the semiconductor manufacturer as users of manufacturing apparatuses. The manufacturing factories 102 to 104 may belong to different manufacturers or the same manufacturer (e.g., a pre-process factory, a post-process factory, and the like). Each of the factories 102 to 104 is equipped with a plurality of manufacturing apparatuses 106, a LAN (Local Area Network) 111, which connects these apparatuses 106 to construct an intranet, and a host management system 107 serving as a monitoring apparatus for monitoring the operation status of each manufacturing apparatus 106. The host management system 107 in each of the factories 102 to 104 has a gateway for connecting the LAN 111 in the factory to the Internet 105 as an external network of the factory. Each factory can access the host management system 108 of the vendor 101 from the LAN 111 via the Internet 105. The security function of the host management system 107 authorizes access of only a limited user. More specifically, the factory notifies the vendor via the Internet 105 of status information (e.g., the symptom of a manufacturing apparatus in trouble) representing the operation status of each manufacturing apparatus 106, and receives response information (e.g., information designating a remedy against the trouble, or remedy software or data) corresponding to the notification or maintenance information such as the latest software or help information. Data communication between the factories 102 to 104 and the vendor 101 and data communication via the LAN 111 in each factory adopt a communication protocol (TCP/IP) generally used in the Internet. Instead of using the Internet as an external network of the factory, a dedicated network (e.g., an ISDN), having high security, which inhibits access of a third party, can be adopted. Also, the user may construct a database in addition to the one provided by the vendor and set the database on an external network, and the host management system may authorize access to the database from a plurality of user factories.

Figure 6:
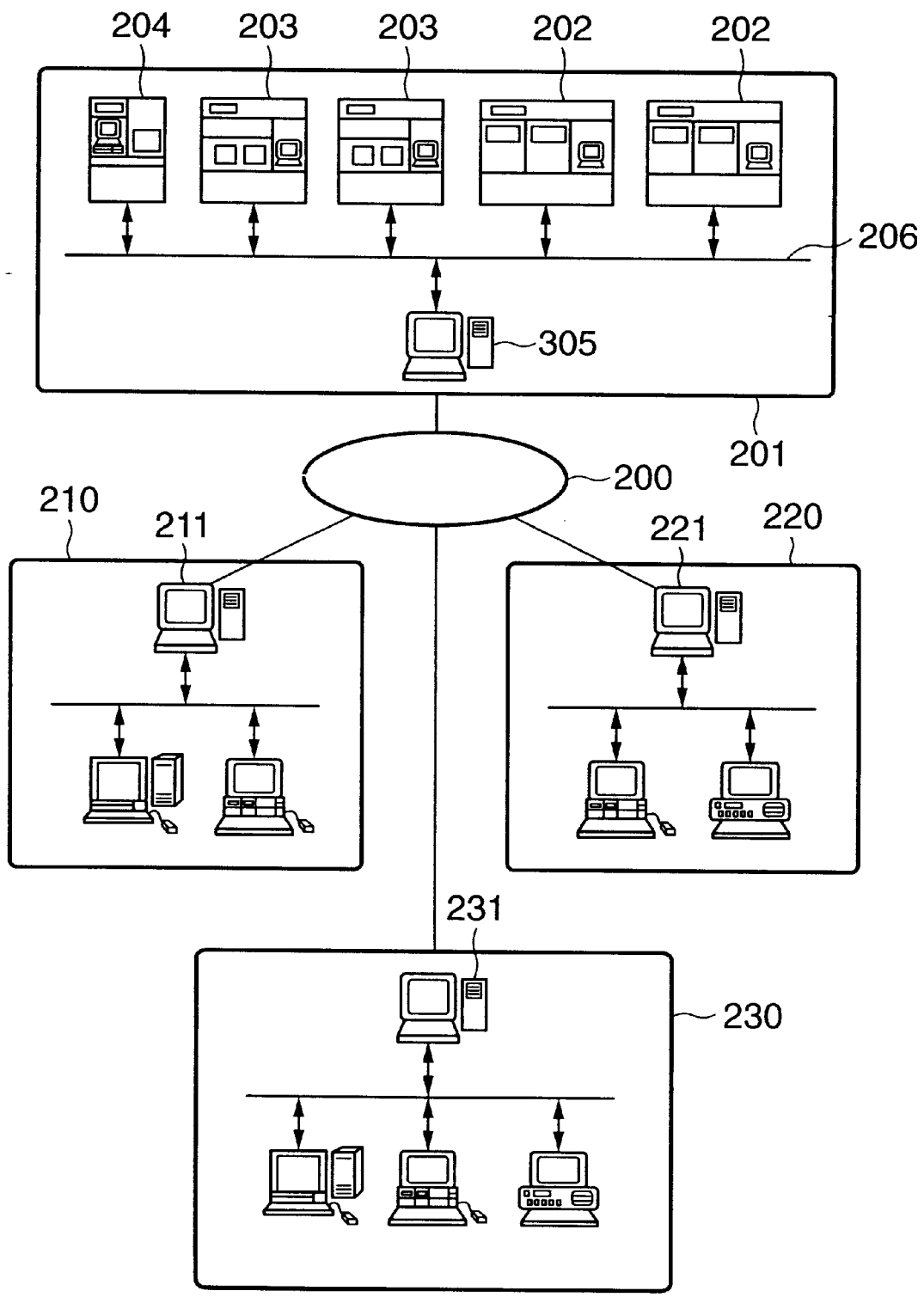
FIG. 6 is a view showing the concept of the semiconductor device production system when viewed from another given angle.

FIG. 6 is a view showing the concept of the overall system of this embodiment that is viewed at a different angle from FIG. 5. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 6, a factory having manufacturing apparatuses of a plurality of vendors for these manufacturing apparatuses are connected via the external network of the factory, and maintenance information of each manufacturing apparatus is communicated. In FIG. 6, reference numeral 201 denotes a manufacturing factory of a manufacturing apparatus user (e.g., a semiconductor device manufacturer) where manufacturing apparatuses for performing various processes, e.g., an exposure apparatus 202, a resist processing apparatus 203, and a film formation apparatus 204 are installed in the manufacturing line of the factory. FIG. 6 shows only one manufacturing factory 201, but a plurality of factories are networked in practice. The respective apparatuses in the factory are connected to a LAN 206 to build an intranet, and a host management system 205 manages the operation of the manufacturing line. The business offices of vendors (apparatus supply manufacturers) such as an exposure apparatus manufacturer 210, a resist processing apparatus manufacturer 220, and a film formation apparatus manufacturer 230 comprise host management systems 211, 221, and 231 for executing remote maintenance for the supplied apparatuses. Each host management system has a maintenance database and a gateway for an external network, as described above. The host management system 205 for managing the apparatuses in the manufacturing factory of the user, and the management systems 211, 221, and 231 of the vendors for the respective apparatuses are connected via the Internet or dedicated network serving as an external network 200. If trouble occurs in any one of a series of manufacturing apparatuses along the manufacturing line in this system, the operation of the manufacturing line stops. This trouble can be quickly solved by remote maintenance from the vendor of the apparatus in trouble via the Internet 200. This can minimize the stoppage of the manufacturing line.

Each manufacturing apparatus in the semiconductor manufacturing factory comprises a display, a network interface, and a computer for executing a network access software and apparatus operating software, which are stored in a storage device. The storage device is a built-in memory, hard disk, or network file server. The network access software includes a dedicated or general-purpose web browser, and provides a user interface having a window as shown in FIG. 7 on the display. While referring to this window, the operator who manages manufacturing apparatuses in each factory inputs, in input items on the windows, pieces of information such as the type of manufacturing apparatus (401), serial number (402), name of trouble (403), occurrence date (404), degree of urgency (405), symptom (406), remedy (407), and progress (408). The pieces of input information are transmitted to the maintenance database via the Internet, and appropriate maintenance information is sent back from the maintenance database and displayed on the display. The user interface provided by the web browser implements hyperlink functions (410 to 412), as shown in FIG. 7. This allows the operator to access detailed information of each item, to receive the latest-version software to be used for a manufacturing apparatus from a software library provided by a vendor, and to receive an operation guide (help information) as a reference for the operator in the factory.

Figure 8:
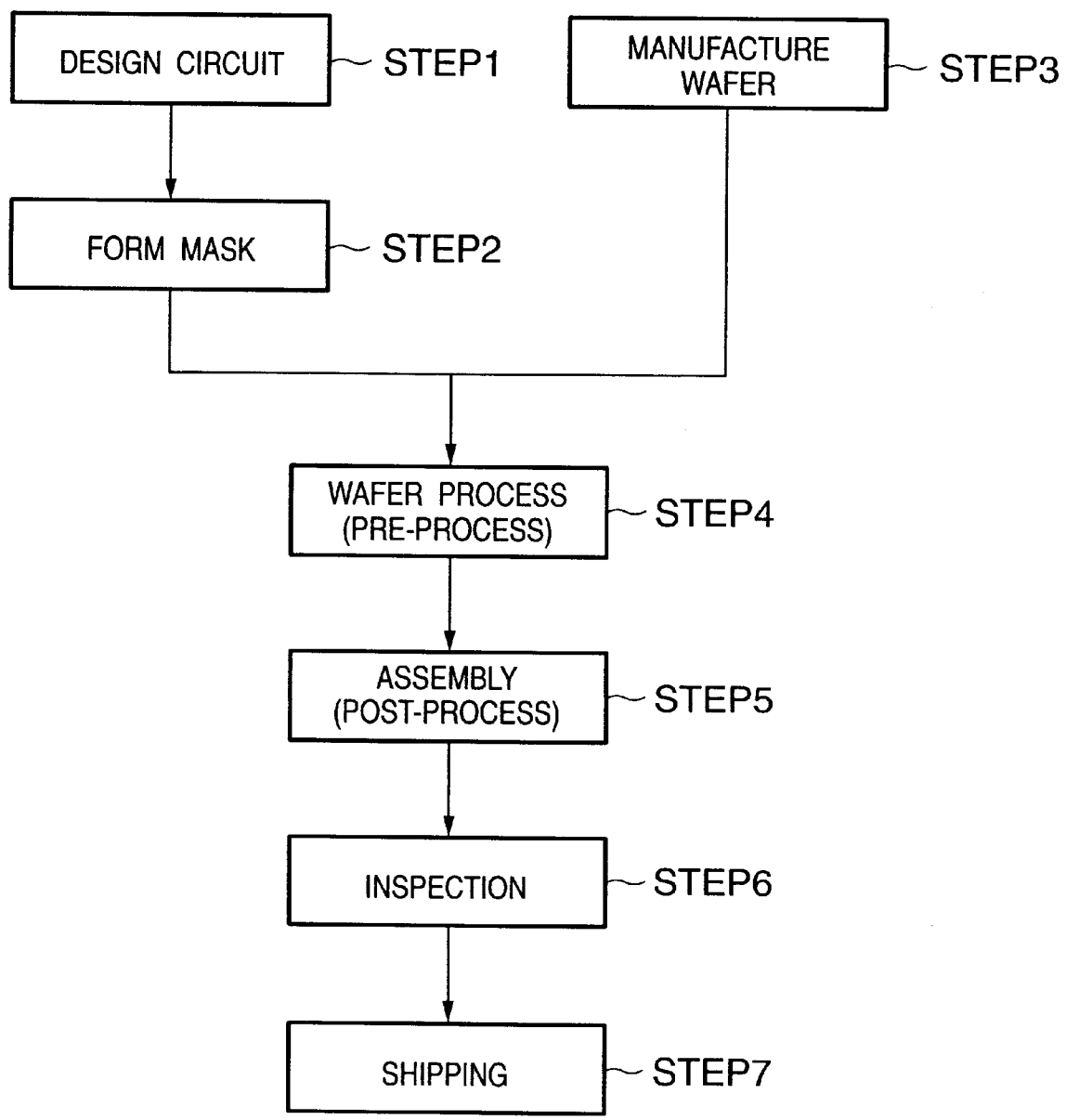
FIG. 8 is a flow chart for explaining the flow of a device manufacturing process.

A semiconductor device manufacturing process using the above-described production system will be explained. FIG. 8 shows the flow of the whole manufacturing process of the semiconductor device. In step 1 (circuit design), a semiconductor device circuit is designed. In step 2 (mask formation), a mask having the designed circuit pattern is formed. In step 3 (wafer manufacture), a wafer is manufactured by using a material such as silicon. In step 4 (wafer process) called a pre-process, an actual circuit is formed on the wafer by lithography using a prepared mask and the wafer. Step 5 (assembly) called a post-process is the step of forming a semiconductor chip by using the wafer manufactured in step 4, and includes an assembly process (dicing and bonding) and a packaging process (chip encapsulation). In step 6 (inspection), inspections such as the operation confirmation test and durability test of the semiconductor device manufactured in step 5 are conducted. After these steps, the semiconductor device is completed and shipped (step 7). The pre-process and post-process are performed in separate dedicated factories, and maintenance is done for each of the factories by the above-described remote maintenance system. Information for production management and apparatus maintenance is communicated between the pre-process factory and the post-process factory via the Internet or dedicated network.

Figure 9:
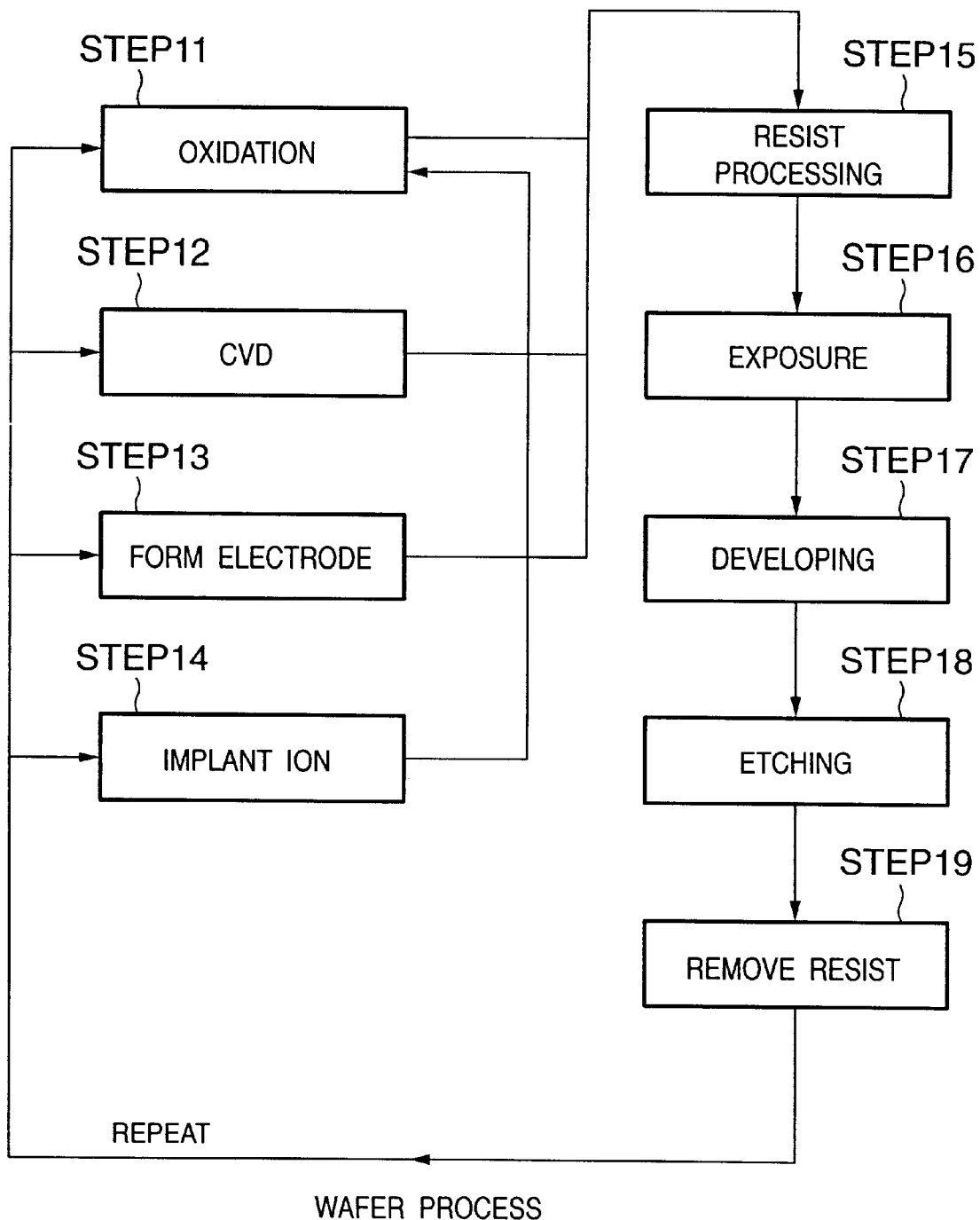
FIG. 9 is a flow chart for explaining a wafer process.

FIG. 9 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus exposes the wafer to the circuit pattern of a mask. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents trouble in advance. Even if trouble occurs, the manufacturing apparatus can be quickly recovered. The productivity of the semiconductor device can be increased in comparison with the prior art.

As has been described above, the reference plate of the present invention enables stable detection of a high-precision mark for a long period even with short-wavelength observation light. The plate surface can be easily cleaned of even a deposit.

As many apparently widely different embodiments of the present invention can be made without departing from the spirit and scope thereof, it is to be understood that the invention is not limited to the specific embodiments thereof except as defined in the appended claims.

What is claimed is:

1. A reference plate used with an exposure apparatus that emits an exposure beam to irradiate a reference mark pattern with observation light, to detect light reflected from the reference mark pattern, and to obtain a position of the reference mark pattern, wherein a respective reference plate is fixed on a mask stage and a wafer stage of the exposure apparatus for exposing a wafer on the wafer stage to a mask pattern on the mask stage; and a surface of the reference mark pattern, which is an observation light irradiation surface side of the exposure apparatus, is not directly exposed to the surrounding atmosphere.

2. The plate according to claim 1, wherein the reference mark pattern is formed on a substrate which transmits the observation light.

3. The plate according to claim 2, wherein the reference mark pattern is formed on a surface opposite to an observation light irradiation surface of the substrate.

4. The plate according to claim 3, wherein letting $\lambda$ be a wavelength of the observation light, a thickness d of the substrate is able to protect an influence from atmosphere in the exposure apparatus and satisfies $$d=\lambda/2 \times m (m=1,2,3,\ldots).$$

5. The plate according to claim 1, wherein the reference mark pattern is formed on an observation light irradiation surface of the substrate, and another substrate which transmits the observation light is formed on a back surface of an observation light irradiation surface side of the reference plate.

6. The plate according to claim 5, wherein letting n be a refractive index of a material of the other substrate with respect to the observation light, and $\lambda$ be a wavelength of the observation light, a thickness d of the substrate is close to a thickness which satisfies $$nd=\lambda/2 \times m (m=1,2,3,\ldots).$$

7. The plate according to claim 1, wherein the reference mark pattern is formed on an observation light irradiation surface of the substrate, and a protective film is formed uniformly on an observation light irradiation surface side of the reference mark pattern.

8. The plate according to claim 7, wherein letting n be a refractive index of the material of the protective film with respect to the observation light, and $\lambda$ be a wavelength of the observation light, a thickness d of the substrate is close to a thickness which satisfies $$nd=\lambda/2 \times m (m=1,2,3,\ldots).$$

9. The plate according to claim 8, wherein the protective film or the substrate is formed from glass or $SiO_2$.

10. The plate according to claim 7, wherein the protective film or the substrate is formed from glass or $SiO_2$.

11. The plate according to claim 1, wherein the reference mark pattern is formed from chromium or aluminum.

12. An exposure apparatus for exposing a wafer to a mask pattern, the exposure apparatus comprising:

reference plates having reference patterns formed at positions where the reference patterns are not directly exposed to observation light, the reference plates including a mask reference plate formed on a mask stage for supporting a mask and a wafer reference plate formed on a wafer stage for supporting the wafer.

13. The apparatus according to claim 12, further comprising an observation microscope for measuring a positional relationship between the mask stage and the wafer stage on the basis of the reference marks by using observation light equal in wavelength to exposure light.

14. The apparatus according to claim 12, further comprising an ArF excimer laser used as a light source of the exposure apparatus.

15. The apparatus according to claim 12, further comprising an $F_2$ excimer laser used as a light source of the exposure apparatus.

16. An exposure apparatus for exposing a wafer to a mask pattern, the exposure apparatus comprising:

a display;

a network interface; and a computer for executing network software, wherein maintenance information of the exposure apparatus can be communicated via a computer network, and the exposure apparatus uses reference plates having reference patterns formed at positions where the reference patterns are not directly exposed to observation light, the reference plates including a mask reference plate formed on a mask stage for supporting a mask and a wafer reference plate formed on a wafer stage for supporting the wafer.

17. The apparatus according to claim 16, wherein the network software is connected to an external network of a factory where the exposure apparatus is installed, provides on said display a user interface for accessing a maintenance database provided by a vendor or user of the exposure apparatus, and enables obtaining information from the database via the external network.

* * * * *